United States Patent [19]

Ishii et al.

[11] Patent Number: 5,041,200
[45] Date of Patent: Aug. 20, 1991

[54] METHOD OF MANUFACTURING CRYSTALLINE THIN-FILM OF RARE-EARTH COMPOUNDS

[75] Inventors: Hiromitsu Ishii, Tokorozawa; Tsuneharu Takeda, Hamura; Kyuya Baba, Hachioji; Ikuhiro Yamaguchi, Hamura, all of Japan

[73] Assignee: Casio Computer Co., Ltd., Tokyo, Japan

[21] Appl. No.: 497,894

[22] Filed: Mar. 22, 1990

[30] Foreign Application Priority Data

Mar. 31, 1989 [JP] Japan ................................... 1-78387
Apr. 21, 1989 [JP] Japan ................................... 1-99962

[51] Int. Cl.$^5$ .............................................. C23C 14/34
[52] U.S. Cl. .............................. 204/192.15; 204/192.2
[58] Field of Search ............ 204/192.15, 192.2, 192.16

[56] References Cited

PUBLICATIONS

Journal of the Less Common Metals, 41 (1975) 329–337, "Rare-Earth Bismuthides", K. Yoshihara et al.
Acta Cryst. (1966), 21, 435–437.
Journal of Less Common Metals, "Rare-Earth-Sb and -Bi Compounds with the $Gd_4Bi_3$ (anti-$Th_3P_4$) Structure", R. J. Gambino, 12 (1967) pp. 344–352.
J. Appl. Phys. 64 (7), Oct. 1, 1988, "Annealing Temperature Dependence of $T_c$ of Thin-Film Gd Grown on a Glass Substrate", O. Nakamura et al.
Journal of Applied Physics, vol. 35, No. 3 (1964), pp. 1033–1038, F. Holtzberg et al.
Growth, Characterization and Properties of Ultrathin Magnetic Films and Multilayers, Materials Research Soceity Symposium Proceedings, Vo. 151, and article entitled, "Thin-Film $Gd_4Bi_3$ Grown on a Glass Substrate", Baba et al., pp. 289–293.

*Primary Examiner*—Nam X. Nguyen
*Attorney, Agent, or Firm*—Frishauf, Holtz, Goodman & Woodward

[57] ABSTRACT

Gd and Bi are used as sputter sources and are simultaneously sputtered, or sputtered alternately, each time in an amount for forming a layer having a thickness of 10 atoms or less, thereby forming a thin film on a substrate, in which Gd and Bi are mixed at a ratio of 4:3. The thin film is heat-treated to form a crystalline thin film having a phase represented by $Gd_4Bi_3$.

21 Claims, 9 Drawing Sheets

METHOD OF MANUFACTURING CRYSTALLINE THIN-FILM OF RARE-EARTH COMPOUNDS

BACKGROUND OF THE INVENTION

1. Field of the Invention

The present invention relates to a method of manufacturing a crystalline thin-film of rare-earth compound by using a physical vapor deposition, such as a vacuum deposition method or a sputtering method and, more particularly, to a method of manufacturing a thin-film of rare-earth pnictide having a crystalline structure of an anti-$Th_3P_4$ type (e.g., $Gd_4Bi_3$, $Gd_4Sb_3$, and $Dy_4Sb_3$) in which a composition ratio of rare-earth elements to that of pnicogen elements is 4:3.

2. Description of the Related Art

Rare-earth pnictides having anti-$Th_3P_4$ type crystal structures include many pnictides having useful physical properties. $Gd_4Bi_3$ and $Gd_4Sb_3$ are ferromagnetic materials having Curie temperatures near room temperature and are expected to be used in a variety of devices. Considering practical applications of these compounds, thin-film formation is an indispensable factor.

Rare-earth pnictides having an anti-$Th_3P_4$ type crystal structure have been conventionally studied for bulk structures. No report concerning thin-film formation of these materials has been reported.

Figure 1:
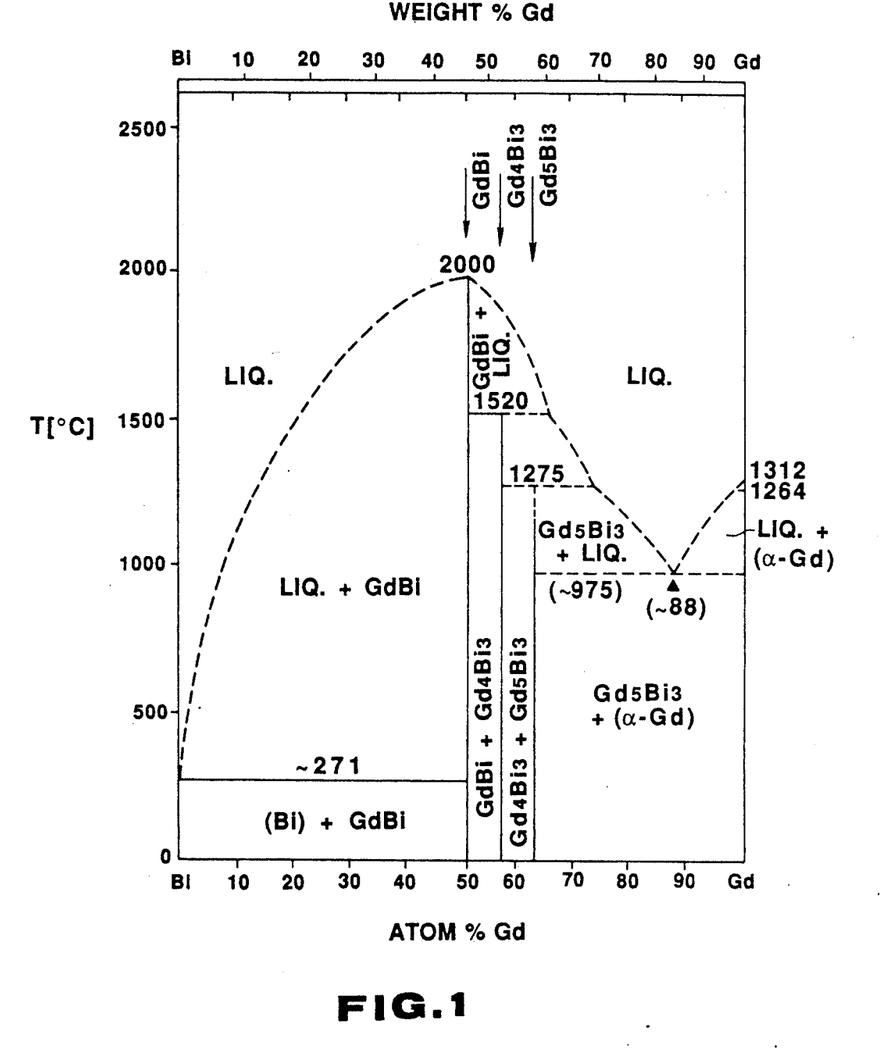
FIG. 1 is a two-element phase diagram of Gd-Bi.

According to a conventional method of manufacturing a bulk structure of rare-earth pnictides, rare-earth elements and pnicogen elements are sealed in a sealable crucible made of a high melting point metal such as molybdenum in an atomic ratio of 4:3, and the resultant mixture is heat-treated at a high temperature for a long period of time. For example, in order to manufacture $Gd_4Bi_3$, as indicated by a phase diagram of a Gd-Bi binary system of FIG. 1, since $Gd_4Bi_3$ has a melting point of 1,520° C. and the adjacent $Gd_5Bi_3$ has a melting point of 1,275° C., the mixture has been heat-treated at a high temperature of 1,275° C. to 1,520° C. for a long period of time. In order to manufacture $Gd_4Sb_3$, as indicated by a phase diagram of Gd-Sb binary system of FIG. 2, since $Gd_4Sb_3$ has a melting point of 1,770° C. and the adjacent $Gd_5Sb_3$ has a melting point of 1,640° C., the mixture has been heat-treated at a high temperature of 1,640° C. to 1,770° C. for a long period of time.

A crystalline thin film is generally manufactured by depositing a thin film on a substrate by using a physical vapor deposition such as a vacuum evaporation method or a sputtering method and by heat-treating the thin film. In the manufacture of a compound thin film, elements constituting the compound have a difference in melting point, and it is impossible to heat-treat the thin film at a high temperature, as opposed to formation of a bulk structure due to the following reason. The difference in melting point between the elements appears as a difference in vapor pressure during the heat treatment. This difference is increased when the temperature is increased. When a heat treatment at a high temperature is performed as in formation of a bulk structure, low-temperature elements in the thin film are evaporated in a relatively large amount, and it is difficult to maintain a composition to a design value. For example, in $Gd_4Bi_3$ and $Gd_4Sb_3$, Gd has a melting point of 1,312° C., whereas Bi has a melting point of 271.3° C. and Sb has a melting point of 630.5° C.. When a heat treatment is performed at a high temperature as in formation of a bulk structure, the element composition ratio in the thin film cannot be maintained as a design value.

This is the main reason why a crystalline thin-film of rare-earth pnictides cannot be formed by a conventional technique.

MBE (Molecular Beam Epitaxy) and the like are conventional thin film manufacturing techniques. According to these techniques, the atomic composition of the thin film to be deposited is precisely controlled, and a target compound is directly manufactured simultaneously with deposition of a thin film. This method, however, must employ an expensive manufacturing apparatus. In addition, this method can be used only for thin-film formation of an alloy such as GaAs whose elements are compatible with each other. There is no report in which a crystalline thin film of rare-earth pnictides is manufactured by this method.

SUMMARY OF THE INVENTION

The present invention has been made in consideration of the above situation, and has as its object to provide a method of accurately manufacturing a crystalline thin film of rare-earth pnictides having an anti-$Th_3P_4$ structure even if a conventional physical vapor deposition method such as a vacuum evaporation or sputtering which allows use of an inexpensive apparatus is used.

It is a second object of the present invention to provide a method of accurately manufacturing a crystalline magnetic thin-film formed of rare-earth pnictides having an anti-$Th_3P_4$ structure.

A method of manufacturing a thin-film of rare-earth pnictides having an anti-$Th_4P_3$ type crystal structure according to the present invention comprises the first step of either simultaneously depositing an RE-component (at least one element selected from the group consisting of rare-earth elements) and a Pn-component (at least one element selected from the group consisting of pnicogen elements) on a substrate, or depositing these components alternately, each time in an amount for forming a layer having a thickness of 10 atoms or less, thereby to form a thin film whose RE-component and Pn-component are well mixed in an atomic ratio of 4:3, and the second step of heat-treating the thin film to form a crystalline thin film having a phase represented by $RE_4Pn_3$.

According to the present invention, since the thin film is formed by either simultaneously depositing or depositing alternately, each time in an amount for forming a layer having a very small thickness of 10 atoms or less, a thin film having a ratio of the Re component to the Pn component of substantially 4:3 and a uniform element distribution can be obtained even if a conventional physical vapor deposition method such as vacuum evaporation or sputtering is used. Atomic diffusion can be effectively performed during the subsequent heat treatment. Therefore, a crystalline thin film or crystalline magnetic thin film consisting of $RE_4Pn_3$ with an anti-$Th_3P_4$ type crystal structure can be manufactured.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrates presently preferred embodiments of the invention and, together with the general description given above and the detailed description of the preferred embodiments given below, serve to explain the principles of the invention.

DETAILED DESCRIPTION OF THE PREFERRED EMBODIMENT

The present invention will be described in detail below. According to the present invention, an RE-component (at least one element selected from the group consisting of rare-earth elements) and a Pn-component (at least one element selected from the group consisting of pnicogen elements) are either simultaneously deposited on a substrate, or deposited alternately, each time in an amount for forming a layer having a thickness of 10 atoms or less, thereby forming a thin film whose RE-component and Pn-component are mixed well in an atomic ratio of 4:3. Thereafter, the thin film is heat-treated to form a crystalline thin film or crystalline magnetic thin film having a phase represented by $RE_4Pn_3$. The rare-earth elements include Sc, Y, La, Ce, Pr, Nd, Pm, Sm, Eu, Gd, Tb, Dy, Ho, Er, Tm, Yb, and Lu, and the pnicogen elements include P, As, Sb, and Bi. Note that a crystalline magnetic thin film can be produced when an element included in the lantanide group, i.e., elements having atomic numbers larger than Ce in the rare-earth elements, is selected as an RE-component.

A substrate on which a thin film is formed must have resistance to a heat treatment temperature and must not easily react with elements of a thin film. In addition, the substrate must have a small thermal expansion coefficient. A surface on which the thin film is formed is preferably a mirror surface. In order to form a Gd-Bi thin film, the thermal expansion coefficient must not exceed $10^{-5}/°$ C. Preferable substrate materials are $SiO_2$, $Al_2O_3$, Si, $Si_3N_4$, GGG (gadolinium gallium garnet).

A method of depositing a thin film is preferably a sputtering method, a vacuum evaporation method (including ultra-high-vacuum evaporation method), or an ion beam deposition method. In such a method, a thin film is formed in a non-oxidizing atmosphere such as a vacuum or inert gas atmosphere, thereby preventing oxidation of the thin film. In this case, a vapor source may be formed by one of elements to be deposited, or a mixture or compound of elements to be deposited. If a mixture or compound is formed of RE and Pn components, only one vapor source need be used. When two or more vapor sources are used, simultaneous or alternate deposition must be properly selected depending on the materials of thin films to be formed.

In this case, deposition conditions for thin films vary depending on thin-film formation methods. In any method, conditions are determined such that a ratio of the RE component to the Pn component is set to be 4:3. In a deposited thin film, if the sizes of coagulated grains of the RE and Pn components are smaller than the order of 100 Å, a good dispersion property can be preferably obtained. The grains of this order can be formed by simultaneous deposition or alternate deposition each time an amount for forming a very thin layer having a thickness of several atoms.

The heat treatment is preferably performed in a vacuum or inert gas atmosphere, but can be performed in other atmospheres. When a heat treatment is performed in an atmosphere other than a vacuum or inert gas atmosphere, an anti-oxidation passivation film is preferably formed on a thin film before the heat treatment.

The passivation film formed on the thin film prevents not only entrance of oxygen into the thin film but also evaporation of the thin-film components. When a heat treatment is performed even in a vacuum or inert gas atmosphere, a passivation film is preferably formed on the thin film. Therefore, variations in component ratios of the thin film during the heat treatment can be prevented, and an allowable temperature range and/or an allowable time rang of the heat treatment can be widened.

A preferable material for the passivation film is selected from materials which can be deposited on a substrate at a temperature below a selected heat-treatment temperature and which have a high density to prevent permeation of oxygen or the like. In addition, the preferable material for the passivation film must not react with a thin film or must not easily react with it. Examples of the passivation film material are SiO, $SiO_2$, $Si_3N_4$, Si, and the like. When an electrode must be formed on the entire surface of a thin-film element such as an optical shutter and a temperature detection element, as described in a co-pending application (Ser. No. 07/406,681) filed on Sept. 13, 1989, U.S. Pat. No. 4,966,445, issued Oct. 30, 1989, a passivation film itself can serve as an electrode. A method of forming a passivation film is not limited to a specific one, but an atmosphere consisting of oxygen, hydrogen, nitrogen, or the like which degrades the thin film must be avoided.

A heat-treatment temperature is metallurgically preferably lower than the melting point of $RE_4Pn_3$, but higher than the melting point of $RE_5Pn_3$, and the like (e.g., 1,275° to 1,520° C. for $Gd_4Bi_3$). However, according to the present invention, the heat treatment can be performed at a temperature lower than a temperature falling within the above range. More specifically, the heat-treatment temperature falls within the range from a temperature immediately below the melting point of $RE_4Pn_3$ to a temperature immediately below a melting point of an element which is contained in $RE_4Pn_3$ and which has the lowest melting point of the elements constituting $RE_4Pn_3$. That is, the heat-treatment temperature preferably falls within the range which allows diffusion of atoms and uniform formation of a crystalline thin film of $RE_4Pn_3$. The allowable temperature range of the heat treatment varies depending on the composition of a thin film to be formed, a material of a substrate, the presence or absence of a passivation film, and its material. However, the heat treatment is preferably performed at a temperature near the upper limit of the allowable temperature range. For example, in order to form a $Gd_4Bi_3$ thin film on an $SiO_2$ substrate without a passivation film, the allowable temperature range is about 271° C. to 550° C., and preferably 480° C. to 540° C. When a passivation film is formed on a $Gd_4Bi_3$ thin film, a heat treatment can be performed at 550° C. or more. In this case, it is natural that the materials for the passivation film and the substrate must sufficiently withstand the heat-treatment temperature.

A crystalline thin film or crystalline magnetic thin film of $RE_4Pn_3$ can be formed by the above method. A technique for forming a passivation film on a thin film to prevent evaporation of components in the thin film during the heat treatment is not only effective for manufacturing a $RE_4Pn_3$ crystalline thin film, but also effective for manufacturing a compound thin film.

EXAMPLES

EXAMPLE 1

An $SiO_2$ (quartz glass) substrate having a mirror-polished perspective thin-film formation surface was used as a substrate, Gd (purity: 99.9%) and Bi (purity: 99.9%) were used as sputter sources, and a radio-frequency sputtering apparatus was used to deposit a thin film by alternately sputtering Gd and Bi. Alternate sputtering was performed such that a sputtering chamber was set in an argon gas atmosphere at a pressure of $1.1 \times 10^{-3}$ Torr (base pressure: $4.0 \times 10^{-7}$ Torr), the plasma power for the sputtering of Gd and Bi was set so as to obtain an atomic ratio of Gd to Bi of 4:3, and sputtering was continued for 18 hours while a rotary disk which supported $SiP_2$ was rotated at a speed of about 3 rpm. More specifically, each cycle consisted of Gd sputtering (about 4 seconds), an interval (about 4 seconds), Bi sputtering (about 4 seconds), and an interval (about 4 seconds) and was repeated for 18 hours. In this case, the substrate was not heated. As a result, a total thickness of the deposited thin film was found to be 1.18 μm (±20%) by a weight measurement. Calculating in terms of the respective sputter rates, it was found that Gd having a thickness equivalent to 0.65 μm and Bi having a thickness equivalent to 0.53 μm were deposited. The thin film formed by the above sputtering operation does not have a clear laminar structure. However, in sputtering of about 4 seconds for each element, it is assumed that Gd having a thickness equivalent to 2.5 Å and Bi having a thickness equivalent to 2.1 Å were formed. In either case, the thickness corresponding to a thickness of three atoms. The sizes of the coagulated grains of Gd and Bi were about 100 Å or less each.

A heat treatment of the resultant thin film was subsequently performed in a sputtering chamber. During the heat treatment, the supply of argon gas to the sputtering chamber was stopped, the pressure in the sputtering chamber was returned to the base pressure of $4 \times 10^{-7}$ Torr, and the thin film was heated at 500° C.±20° C. for 28 hours. A temperature rise rate was set to be 100° C./hour, and a temperature fall rate was set to be about 250° C./hour.

$Gd_4Bi_3$ is very unstable against oxygen and moisture. For this reason, a prepassivation film was formed by sputtering of Gd on a thin film after the heat treatment, one of the sputter sources was then replaced with an $SiO_2$, and an $SiO_2$ source was sputtered, thereby forming $SiO_2$ passivation film on the thin film. During this process, the substrate was kept at 100° C.

X-ray diffraction measurement was performed for the resultant thin film (to be referred to as a thin-film sample 1 hereinafter). A diffraction spectrum shown in FIG. 1 was obtained. The X-ray diffraction was performed by using a Kc-ray of Cu at a measurement wavelength λ of 1.542 Å or more. As is apparent from FIG. 1, peaks of $Gd_5Bi_3$ and GdBi existed and the peak of the (310) plane of $Gd_4Bi_3$ was confirmed. It was found that the $Gd_4Bi_3$ phase was contained in the thin film in an amount of 30%, from the peak of (310) plane of $Gd_4Bi_3$. This could also be confirmed by the magnitude of magnetization by a VSM (Vibrating-Sample Magnetometer) measurement.

Figure 2:
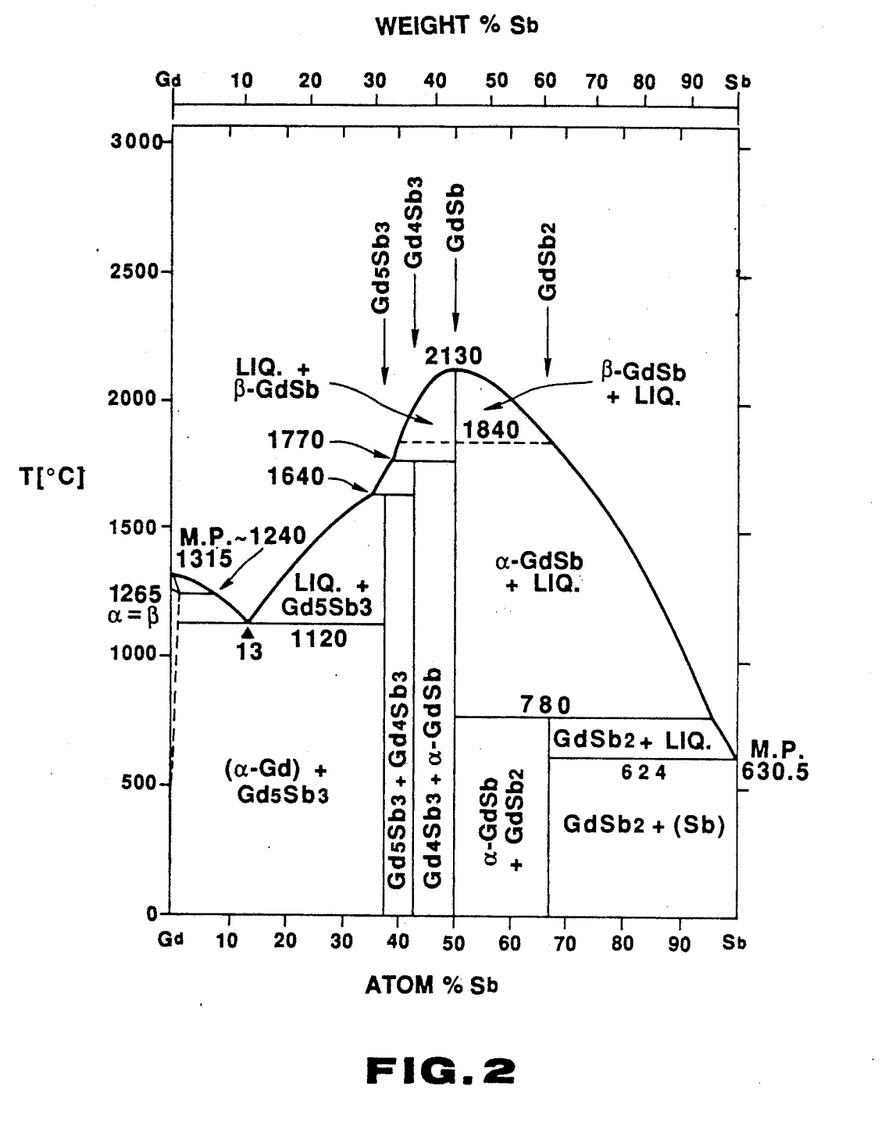
FIG. 2 is a two-element phase diagram of Gd-Sb.
Figure 3:
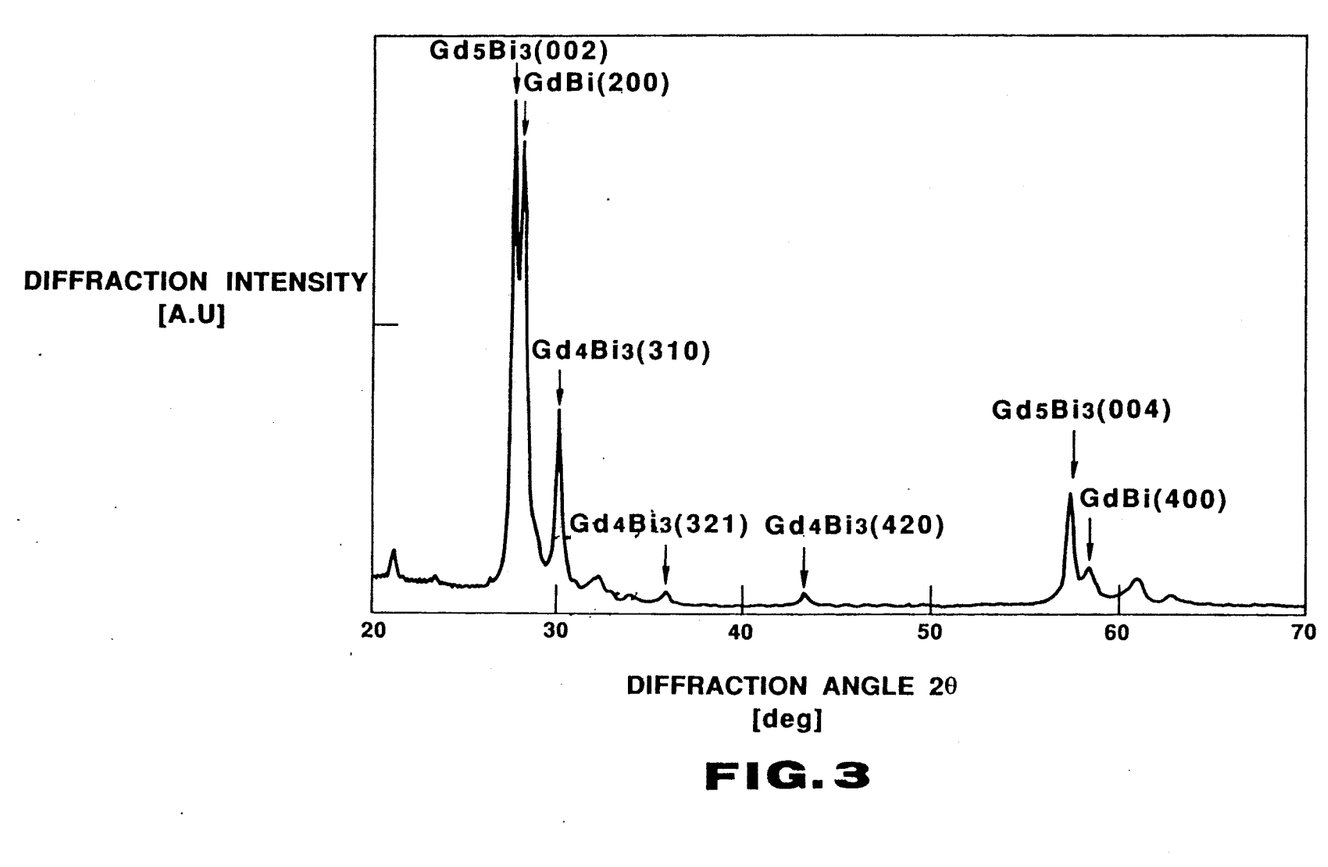
FIG. 3 is a graph showing an X-ray diffraction spectrum of a thin-film sample 1 manufactured by a method of the present invention.
Figure 4:
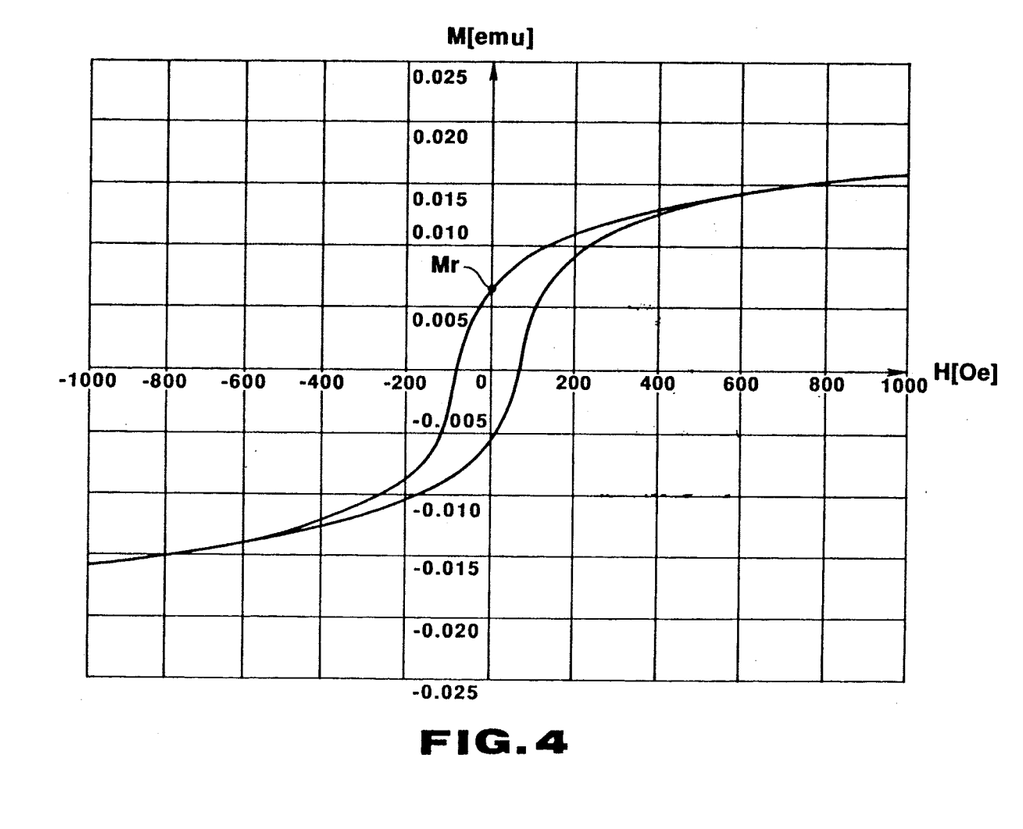
FIG. 4 is a graph showing an M-H curve of the thin-film sample 1.

A magnetization-magnetic field curve of the thin-film sample 1 is shown in FIG. 2. This curve is obtained from a measurement with a VSM apparatus. As shown in FIG. 2, a hysteresis curve is drawn, and the resultant thin film was confirmed as a ferromagnetic body. An intersection between the ordinate and the magnetization-magnetic field curve in FIG. 4 represents residual magnetization. The residual magnetization is reduced when the temperature is increased. A temperature corresponding to zero residual magnetization is obtained as a Curie temperature. A measured Cure temperature was 329K (56° C.), which fell within an allowable experimental error range of the Curie temperature (340K) of bulk $Gd_4Bi_4$, as described in a literature (F. Holtzberg et al., JAP, Vol. 35, No. 3 (1964), pp. 1033–1038).

Figure 5:
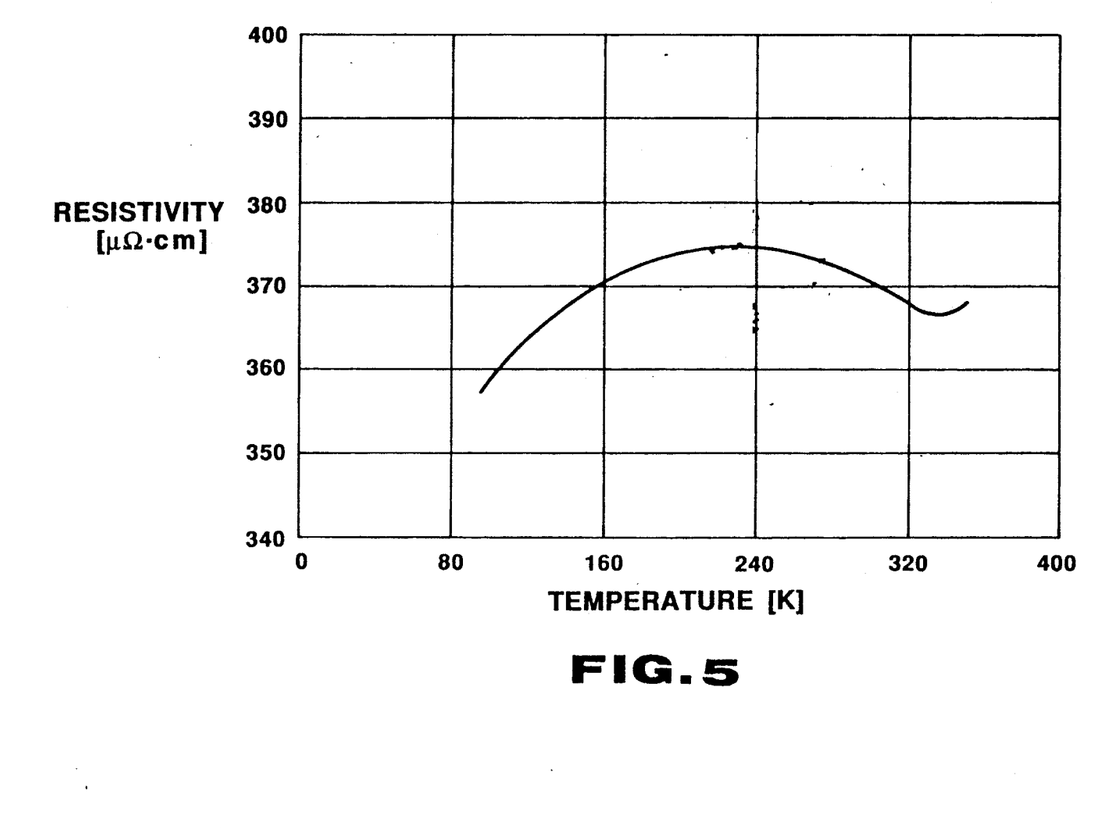
FIG. 5 is a graph showing temperature dependency of electric resistances of the thin-film sample 1.

Temperature dependency of electric resistances of the thin-film sample 1 is shown in FIG. 5. The temperature dependency of the resistance values of this sample has the same tendency as the $Gd_4Bi_3$ bulk in the above literature.

EXAMPLE 2

A thin film was deposited by using the same substrate and sputter sources as in Example 1 by the same apparatus as in Example 1. The sputter rates of Gd and Bi were the same as those in Example 1. However, the substrate was rotated at a speed of 10 to 11 rpm. Each cycle consisted of Gd sputtering (about 1.5 seconds), an interval (about 1.5 seconds), Bi sputtering (about 1.5 seconds), and an interval (about 1.5 seconds) and was repeated for 18 hours to form a thin film. In this case, the substrate was not heated. A total thickness of the deposited thin film was found to be 1.18 μm (±20%) by a weight measurement. Calculating in terms of the sputter rates, it was found that Gd having a thickness equivalent to 0.65 μm and Bi having a thickness equivalent to 0.53 μm were deposited. The thin film formed by the above sputtering operation does not have a clear laminar structure. However, in sputtering of about 1.5 seconds for each element, it is assumed that Gd having a thickness equivalent to 0.94 Å and Bi having a thickness of equivalent to 0.79 Å were formed. In either case, this thickness roughly corresponds to a thickness of one atom. The sizes of the coagulated grains of Gd and Bi were about 100 Å or less each.

A heat treatment of the resultant thin film was subsequently performed in a high vacuum of $4.0 \times 10^{-7}$ Torr at 520° C.±10° C. for 4 hours. Temperature rise and fall rates were set to be the same as in Example 1. Note that the passivation film was formed following the same procedures as in Example 1.

Figure 6:
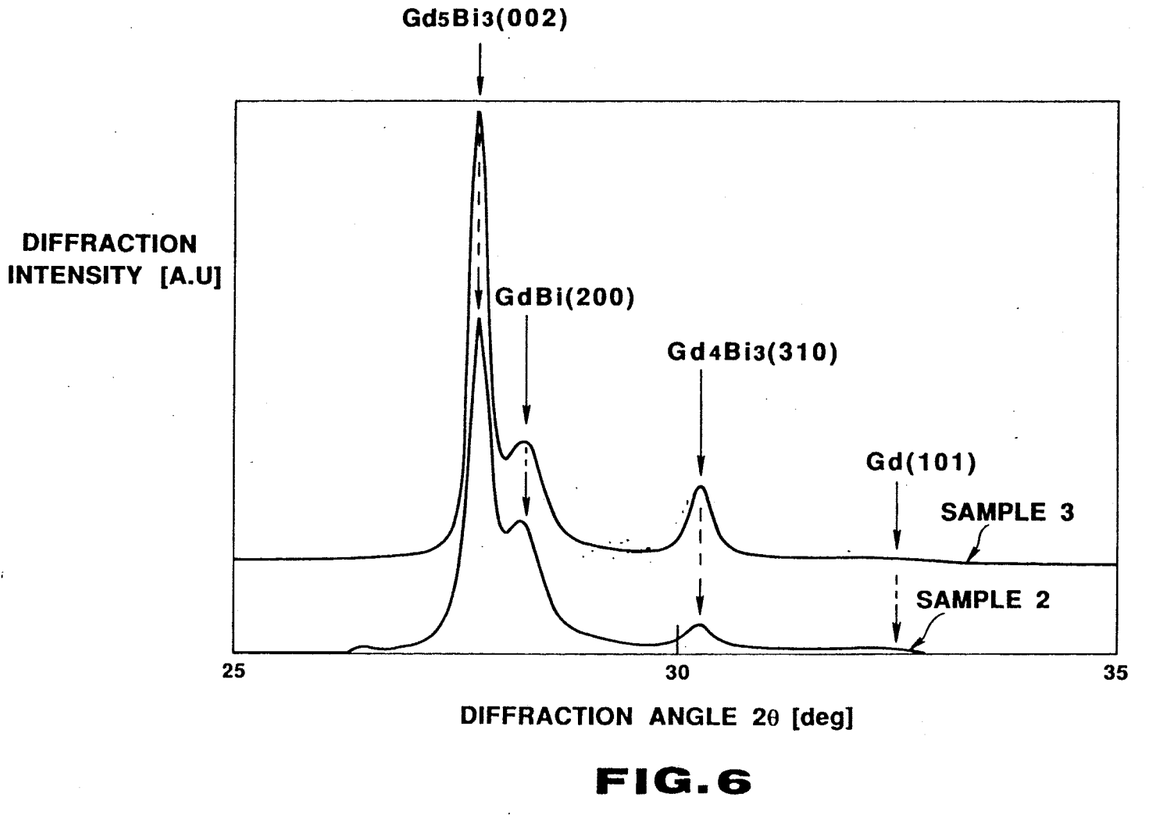
FIG. 6 is a graph showing X-ray diffraction spectra of thin-film samples 2 and 3 manufactured by a method of the present invention.

X-ray diffraction measurement was performed for the resultant thin film (to be referred to as a thin-film sample 2 hereinafter). A diffraction spectrum shown in FIG. 6 is obtained. The diffraction measurement was performed following the same procedures as in Example 1. As can be apparent from FIG. 6, the strong peak of the (310) plane of $Gd_4Bi_3$ was confirmed as in the case of the thin-film sample 1 in Example 1, and formation of a $Gd_4Bi_3$ polycrystalline body oriented to the (310) plane was confirmed.

Figure 7:
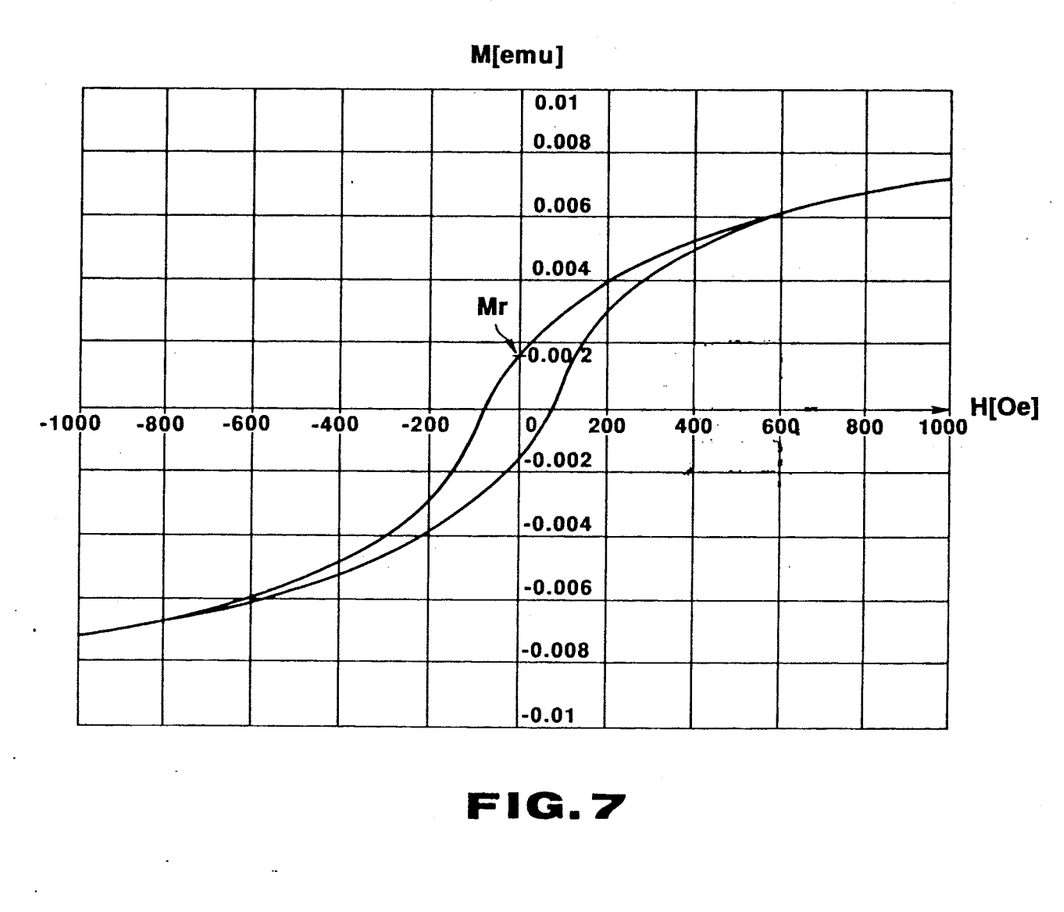
FIG. 7 is a graph showing an M-H curve of the thin-film sample 2.

A magnetization-magnetic field curve of the thin-film sample 2 is shown in FIG. 7. This curve is obtained from a measurement with a VSM apparatus. As shown in FIG. 7, a hysteresis curve is drawn, and the resultant thin film was confirmed as a ferromagnetic body. A measured Curie temperature was almost the same as that measured for the thin-film sample 1. In Example 2, it was confirmed that $Gd_4Bi_3$ was contained in the thin film in an amount of about 14%. Temperature dependency of the electric resistance of the sample 2 had the same tendency as that of the sample 1.

EXAMPLE 3

Figure 8:
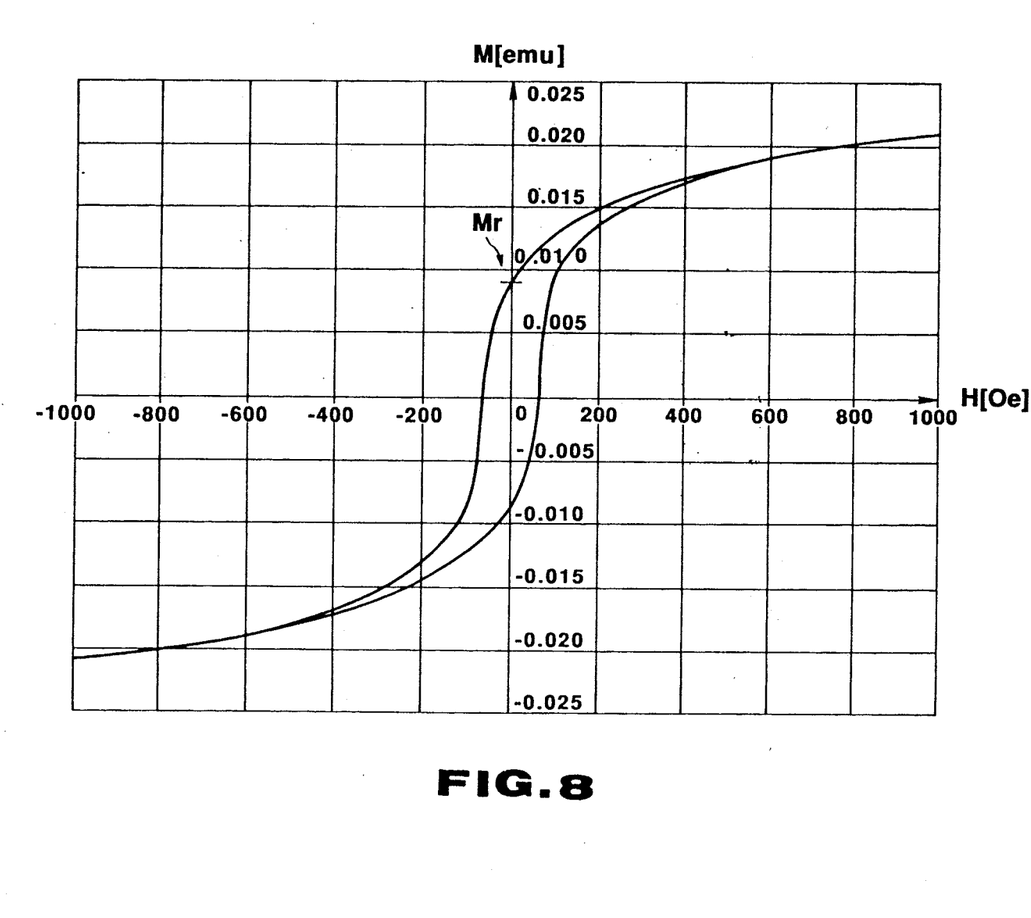
FIG. 8 is a graph showing an M-H curve of the thin-film sample 3.

A thin-film sample 3 was prepared following the same procedures as in Example 2 except that a film heat-treatment temperature was set to be 530°±10° C. X-ray diffraction measurement was performed for the sample 3, and a result shown in FIG. 6 was obtained. That is, a strong peak of the (310) plane of $Gd_4Bi_3$ was confirmed, and it was found that a $Gd_4Bi_3$ polycrystalline body oriented to the (310) plane was formed. A peak level of the (310) plane of $Gd_4Bi_3$ was higher than that of the thin-film sample 2 manufactured in Example 2, and therefore the content of $Gd_4Bi_3$ was found to be larger than that of the sample 2. A magnetization curve obtained with a VSM apparatus was a hysteresis curve shown in FIG. 8. Judging from this magnetization curve, sample 3 was confirmed to be a ferromagnetic body as in the previous samples. The sample 3 had almost the same Curie temperature as those of the previous samples. Temperature dependency of the electric resistance of the sample 3 had the same tendency as the samples 1 and 2.

COMPARATIVE EXAMPLE

Figure 9:
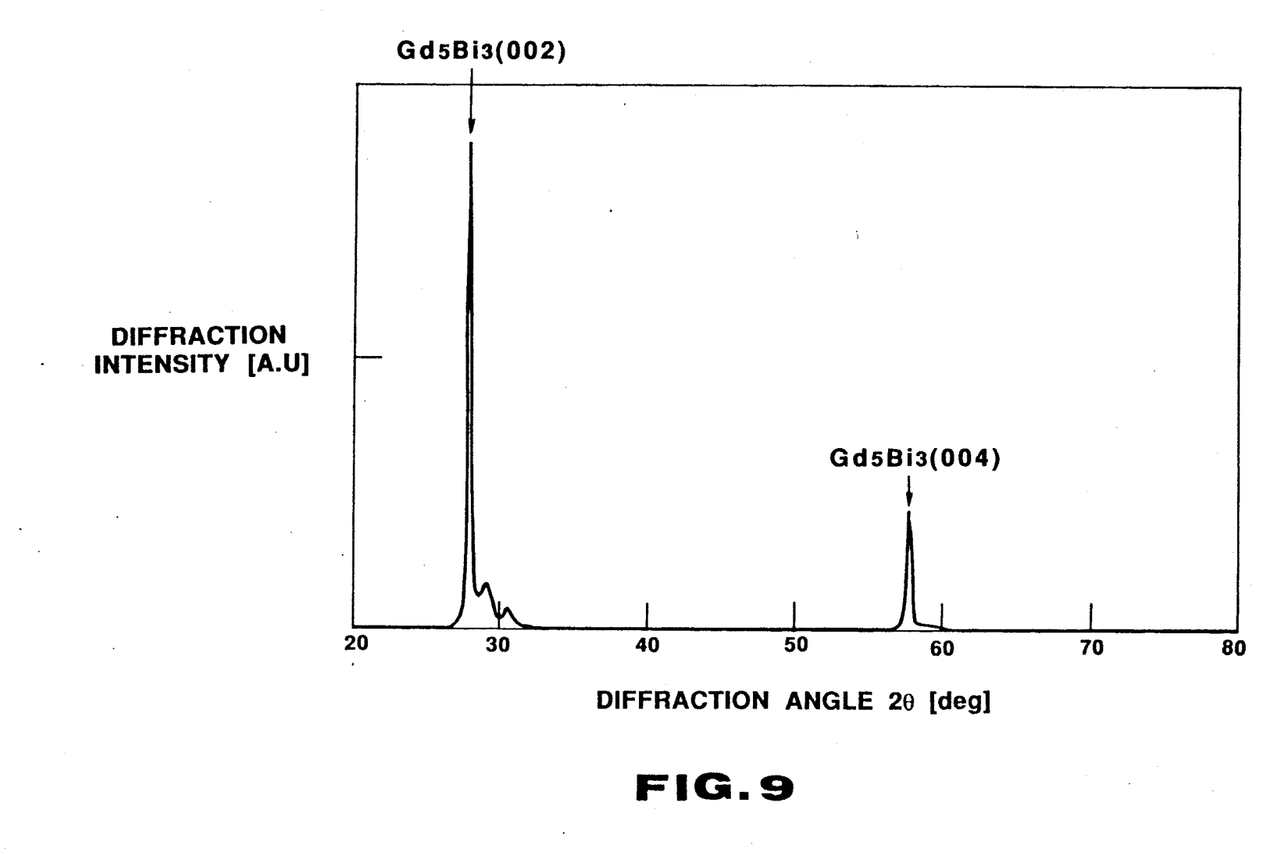
FIG. 9 is a graph showing an X-ray diffraction spectrum of a thin-film sample of a comparative example.

As a comparative example, a thin film was formed by alternately sputtering Gd and Bi every minute (Gd for a deposition thickness of about 38 Å and Bi for a deposition thickness of about 31 Å; total thickness: 0.97 μm; Gd:Bi=4:3), and the resultant thin film was heat-treated to prepare a sample. X-ray diffraction measurement was performed for this sample, and a result is shown in FIG. 9. As is apparent from FIG. 9, a peak representing a $Gd_4Bi_3$ crystal could not be confirmed because a sputtering amount of each sputtering operation was excessive, and uniformity of the component distribution of the thin film could not be obtained to fail to effectively form a $Gd_4Bi_3$ phase during the heat treatment.

EXAMPLE 4

It was confirmed that a $Gd_4Bi_3$ phase was effectively formed by extremely reducing the thickness of each film formed by one sputtering operation of each sputter source.

The $Gd_4Bi_3$ thin film has a Curie temperature of 56° C. and can be effectively used as a temperature detecting element operated in a room temperature range, or a thin-film inductance element effectively operated in the room temperature range.

The above embodiments exemplify only $Gd_4Bi_3$, but other $RE_4Pn_3$ compounds can equally manufactured, as a matter of course. The number of elements constituting $RE_4Pn_3$ is not limited to two, but may be three or more. For example, $Gd_4(Bi_{1-x}Sb_x)_3$ may be used in which part of $Gd_4$ is substituted with Sb. $Gd_4(Bi_{1-x}Sb_x)_3$ is also effective as a material for a temperature detection element. More specifically, $Gd_4(Bi_{1-x}Sb_x)_3$ is also a ferromagnetic material like $Gd_4Bi_3$ and $Gd_4Sb_3$, as described in the previous literature, and a Curie temperature of $Gd_4(Bi_{1-x}Sb_x)_3$ is changed between the Curie temperature of $Gd_4Sb_3$ and the Curie temperature of $Gd_4Bi_3$ in accordance with a substitution amount of Sb. A $Gd_4(Bi_{1-x}Sb_x)_3$ thin film can form any temperature detection element whose detection temperature can be changed in the range of 260K to 329K.

As described above, according to the method of manufacturing a crystalline thin film, a thin film can be formed by simultaneous deposition or alternate deposition of very thin layers having a thickness of 10 atoms or less. Even if a conventional physical vapor deposition such as vacuum deposition or sputtering is used, a ratio of the RE component to the Pn component can be substantially 4:3, and a thin film having good uniformity of an element distribution can be obtained. Therefore, atomic diffusion occurs in the subsequent heat treatment, and a crystalline thin film or crystalline magnetic thin film having an $RE_4Pn_3$ composition of an anti-$Th_3P_4$ type crystal structure can be manufactured.

Additional advantages and modifications will readily occur to those skilled in the art. Therefore, the invention in its broader aspects is not limited to the specific details, and illustrated examples shown and described. Accordingly, various modifications may be made without departing from the spirit or scope of the general inventive concept as defined by the appended claims and their equivalents.

What is claimed is:

1. A method of manufacturing a thin film of rare-earth pnictides having an anti-$Th_3P_4$ type crystal structure, comprising:
    a first step of either simultaneously depositing an RE-component comprising at least one element selected from the group consisting of rare-earth elements and a Pn-component comprising at least one element selected from the group consisting of pnicogen elements on a substrate, or depositing the RE-component and the Pn-component alternatively, each deposit of the components being in an amount for forming a layer having a thickness of not more than 10 atoms, thereby forming a thin film whose RE-component and Pn-component are well mixed in an atomic ratio of 4:3; and
    a second step of heat-treating the thin film to form a crystalline thin film having a phase represented by $RE_4Pn_3$.

2. The method according to claim 1, wherein the RE-component and the Pn-component are deposited by sputtering.

3. The method according to claim 1, wherein the RE-component and the Pn-component are deposited by alternate sputtering thereof.

4. The method according to claim 3, wherein said alternate sputtering is performed such that a plasma power of sputter sources of the RE-component and the Pn-component are set so as to obtain an atomic ratio of the RE-component to the Pn-component of 4:3, and a sputtering time of the RE-component is equal to that of the Pn-component.

5. The method according to claim 1, further comprising the step of forming a passivation film on the thin film after the second step.

6. The method according to claim 5, wherein the passivation film comprises a material selected from the group consisting of SiO, $SiO_2$, $Si_3N_4$ and Si.

7. The method according to claim 1, wherein the second step is performed after a passivation film is formed on the thin film.

8. The method according to claim 1, wherein the rare earth element is selected from the group consisting of Sc, Y, La, Ce, Pr, Nd, Pm, Sm, Eu, Gd, Tb, Dy, Ho, Er, Tm, Yb and Lu; the pnicogen element is selected from the group consisting of P, As, Sb, Bi and mixtures thereof; and the substrate is selected from the group consisting of $SiO_2$, $Al_2O_3$, Si, $Si_3N_4$ and gadolinium gallium garnet.

9. The method according to claim 8, wherein the heat-treating is conducted at a temperature of lower than the melting point of $RE_4Pn_3$ and higher than the melting point of $RE_5Pn_3$.

10. The method according to claim 1, wherein the RE-component is Gd, the Pn-component is Bi, the substrate is $SiO_2$ and the heat treating is conducted at a temperature of 271° C. to 550° C.

11. The method according to claim 1, wherein the RE-component is Gd and the Pn-component is selected from the group consisting of Bi, Sb and mixtures thereof.

12. A method of manufacturing a magnetic thin film of rare-earth pnictides having an anti-$Th_3P_4$ type crystal structure, comprising: p1 a first step of either simultaneously depositing an RE-compcnent comprising at lest one element selected from the group consisting of lanthanides and a Pn-component comprising at least one element selected from the group consisting of pnicogen elements on a substrate, or depositing the RE-component and the Pn-component alternatively, each deposit of the components being in an amount for forming a layer having a thickness of not more than 10 atoms, thereby forming a thin film whose RE-component and Pn-component are well mixed in an atomic ratio of 4:3; and a second step of heat-treating the thin film to form a crystalline thin film having a phase represented by $RE_4Pn_3$.

13. The method according to claim 12, wherein the RE-component is Gd, and the Pn-component is Bi.

14. The method according to claim 12, wherein the RE-component is Gd, and the Pn-component is Sb.

15. The method according to claim 12, wherein the RE- and Pn-components are deposited by sputtering.

16. The method according to claim 12, wherein the RE-component and the Pn-component are deposited by alternate sputtering thereof.

17. The method according to claim 16, wherein said alternate sputtering is performed such that a plasma power of sputter sources of the RE-component and the Pn-component are set so as to obtain an atomic ratio of the RE-component to the Pn-component of 4:3, and a sputtering time of the RE-component is equal to that of the Pn-component.

18. The method according to claim 12, further comprising the step of forming a passivation film on the thin film after the second step.

19. The method according to claim 12, wherein the second step is performed after a passivation film is formed on the thin film.

20. The method according to claim 12, wherein the lantanide is selected from the group consisting of Pr, Nd, Pn, Sn, Eu, Gd, Tb, Dy, Ho, Er, Tm, Yb and Lu.

21. The method according to claim 12, wherein the RE-component is Gd, the Pn-component is Bi, the substrate is $SiO_2$ and the heat treating is conducted at a temperature of 271° C. to 550° C.

* * * * *